United States Patent
Saitoh

[11] Patent Number: 5,946,593
[45] Date of Patent: Aug. 31, 1999

[54] SEMICONDUCTOR DEVICE MANUFACTURING METHOD

[75] Inventor: Kenji Saitoh, Tokyo, Japan

[73] Assignee: Mitsubishi Denki Kabushiki Kaisha, Tokyo, Japan

[21] Appl. No.: 08/603,351

[22] Filed: Feb. 20, 1996

Related U.S. Application Data

[30] Foreign Application Priority Data

Jun. 23, 1995 [JP] Japan .............................. P07-157721
Nov. 2, 1995 [JP] Japan .............................. P07-285844

[51] Int. Cl.⁶ ................................................. H01L 21/469
[52] U.S. Cl. ......................... 438/640; 438/701; 438/673; 438/702; 257/774; 257/760
[58] Field of Search .................................... 437/195, 228, 437/231, 235, 238; 257/760, 794, 774; 438/624, 702, 763, 640, 666, 673, 700, 734, 713, 701

[56] References Cited

U.S. PATENT DOCUMENTS

| | | |
|---|---|---|
| 4,832,789 | 5/1989 | Cochran et al. . |
| 5,177,588 | 1/1993 | Ii et al. . |
| 5,219,792 | 6/1993 | Kim et al. ............................ 437/195 |
| 5,246,883 | 9/1993 | Lin et al. . |
| 5,413,963 | 5/1995 | Yen et al. ............................ 437/195 |
| 5,435,888 | 7/1995 | Kalnitsky et al. . |
| 5,457,073 | 10/1995 | Ouellet ............................ 437/231 |
| 5,470,793 | 11/1995 | Kalnitsky . |
| 5,554,567 | 9/1996 | Wang .................................... 437/195 |
| 5,597,764 | 1/1997 | Koh et al. ............................ 437/195 |
| 5,652,172 | 7/1997 | Yung-Sung et al. . |

*Primary Examiner*—Caridad Everhart

[57] ABSTRACT

A semiconductor device is manufactured in accordance with the procedure as follows. At first, there is formed an interlayer insulating film including a SOG film (3) overlying a first metal wiring (1), a thin silicon nitride film (10) overlying the SOG film (3) and an oxide film (4) overlying the silicon nitride film (10). Next, an isotropic etching is performed to the oxide film (4). Then, there is formed a throughhole (7) through the interlayer insulating film so as to expose the first metal wiring (1) outward. Moreover, there is formed another oxide film (11) onto the semiconductor device on a way of a manufacturing process thereof. Thus, there is performed a whole anisotropic etching onto the other oxide film (11) by means of a dry etching process thus to reserve the other oxide film (11a) only on a side wall of the throughhole (7). Finally, there is formed a second metal wiring (8) connected to the first metal wiring (1) through the throughhole (7).

7 Claims, 4 Drawing Sheets

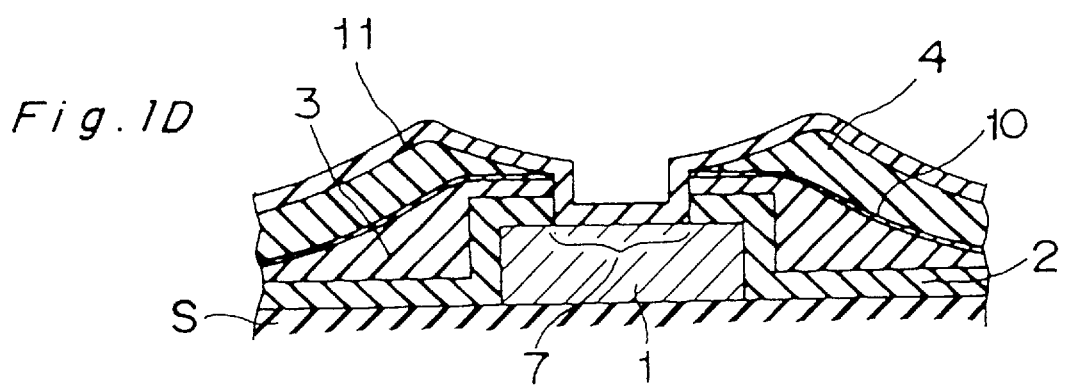
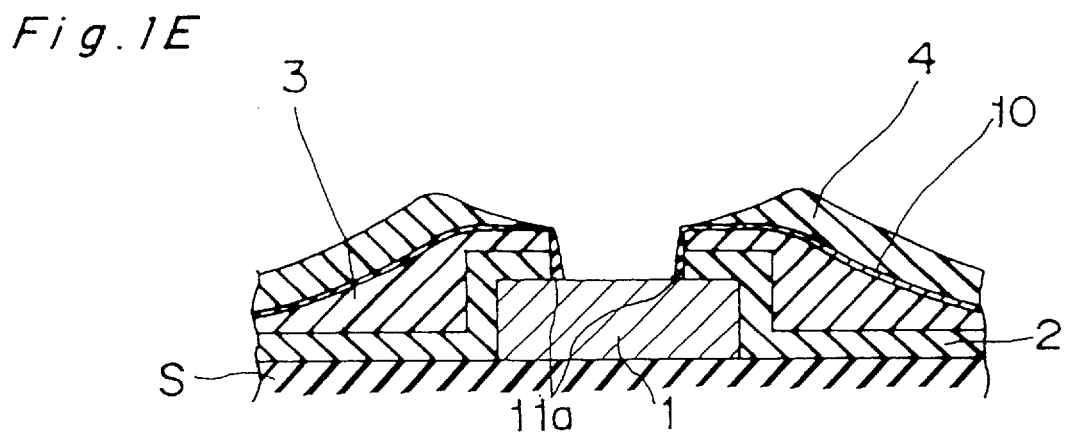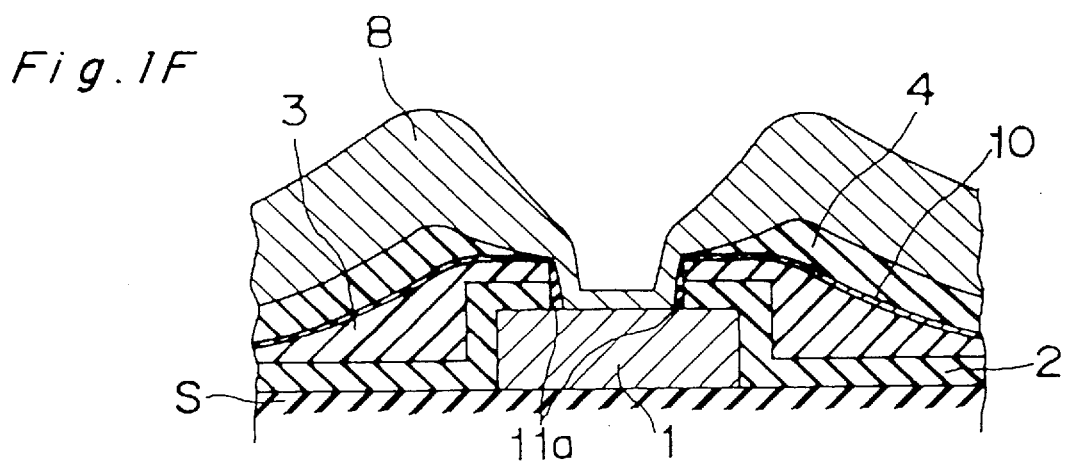

SEMICONDUCTOR DEVICE MANUFACTURING METHOD

FIELD OF THE INVENTION

The present invention relates to a semiconductor device and a manufacturing method thereof, and more particularly, to a technique for stabilizing and improving contact resistance of a throughhole portion connecting a lower layer aluminum wiring to an upper layer aluminum wiring in a semiconductor device which includes a SOG (Spin On Glass) film in order to improve flatness between multi-layer aluminum wiring thereof.

DESCRIPTION OF THE PRIOR ART

Recently, use of semiconductor devices having a multi-layer aluminum wiring structure therein is increasing with increasing circuit of integration density. Hereinafter a conventional manufacturing method of such a semiconductor device having a multi-layer aluminum wiring structure will be described with reference to FIGS. 2A to 2D.

In the conventional manufacturing method of the semiconductor device, as shown in FIG. 2A, at first, a patterning treatment is generally performed to a desired portion of a first layer aluminum wiring 1. Then, there is formed a first oxide film 2 which can be formed at a low temperature and has a good moisture resistance, as an interlayer insulating film, by means of plasma CVD method (Hereinafter, this oxide film will be called "first plasma oxide film 2").

Next, a SOG (Spin On Glass) film 3 is applied on the first plasma oxide film 2 by using a coater in order to improve flatness of the upper surface of the semiconductor device during of its manufacturing process, as shown in FIG. 2B. Further, a second oxide film 4 is deposited on the SOG film 3 as an interlayer insulating film by means of plasma CVD method (Hereinafter, this oxide film will be called "second plasma oxide film 4"), since the moisture resistance of the SOG film 3 is generally weak.

Then, there is formed a resist pattern 5 for forming a throughhole 7 at a desired portion of the semiconductor device on the way of its manufacturing process, by means of photoengraving process, as shown in FIG. 2C. Further, an isotropic etching is performed to the second plasma oxide film 4 by means of such chemicals as dilute hydrofluoric acid etc. so that a taper portion 6 for reducing the aspect ratio of the throughhole 7 is formed. Next, an anisotropic dry etching is performed to the semiconductor device during of its manufacturing process so that the throughhole 7 is formed, the throughhole 7 penetrating the second plasma oxide film 4, the SOG film 3 and the first plasma oxide film 2 respectively so as to expose the first layer aluminum wiring 1 outward. Thus, after the resist pattern 5 has been removed, a second layer aluminum wiring 8 is formed by means of sputter method, as shown in FIG. 2D.

However, in the above-mentioned conventional manufacturing method of the semiconductor device, when the isotropic etching is performed by means of such chemicals as dilute hydrofluoric acid etc., the chemicals sometimes penetrates the second plasma oxide film 4 so as to get to the SOG film 3 due to a variance of a thickness of the second plasma oxide film 4 or a variance of etching rate of the chemicals. Thus, in this case, there occurs the problem that side etching of the SOG film 3 is caused so that a disconnection or a defective connection is caused in the second layer aluminum wiring 8, for example, as shown in FIG. 3.

Moreover, there is also such another problem that due to aqueous vapor ($H_2O$) which escapes from the SOG film 3, the second layer aluminum wiring 8 is converted to alumina 9 ($Al_2O_3$) at a portion contacting with the SOG film 3 so that an abnormal contact resistance is caused.

SUMMARY OF THE INVENTION

The present invention has been developed to solve the above-mentioned conventional problems, and has an object of providing a semiconductor device and a manufacturing method thereof, which can prevent side etching of the SOG film. Further, the present invention has another object of providing a semiconductor device and a manufacturing method thereof, which can prevent quality change of a second layer aluminum wiring at a portion contacting with the SOG film.

Thus, according to an aspect of the present invention which is developed to achieve the above-mentioned objects, there is provided a manufacturing method of a semiconductor device which comprises the steps of forming an interlayer insulating film which includes a SOG film overlying a first metal wiring disposed on a substrate, a thin silicon nitride film overlying the SOG film and an oxide film overlying the silicon nitride film, performing an isotropic etching to the oxide film at a position corresponding to the first metal wiring, forming a throughhole through the interlayer insulating film so as to expose the first metal wiring outward, and forming a second metal wiring connected to the first metal wiring through the throughhole.

In the above-mentioned manufacturing method, the thin silicon nitride film formed on the SOG film is not etched by the etching chemicals used in the process such as dilute hydrofluoric acid etc. Thus, when the isotropic etching by chemicals such as hydrofluoric acid etc. is performed to the oxide film on the silicon nitride film to form a taper portion, even if the oxide film is abnormally thinner or the etching rate is abnormally higher, the SOG film under the silicon nitride film is not etched. Therefore, even if there occurs a variance in the thickness of the oxide film or in the etching rate of the chemicals, side etching of the SOG film does not occur. Thus, there is obtained a semiconductor device of good quality, in which a disconnection or a defective connection is not caused.

Further, in the above-mentioned manufacturing method, it is preferable that the method further comprises the step of forming an oxide layer which overlies a side wall of the throughhole, between the throughhole forming step and the second metal wiring forming step.

In this case, since direct contact in the throughhole between the second metal wiring and the SOG film is prevented by the oxide layer, escape of aqueous vapor ($H_2O$) from the SOG film is prevented so that quality change of the second metal wiring due to the aqueous vapor is effectively prevented. Thus, contact resistance of the semiconductor device becomes better so that quality of the semiconductor device is highly improved.

Still further, in the above-mentioned manufacturing method, it is more preferable that the oxide layer forming step comprises the steps of forming another oxide film onto the semiconductor device during the manufacturing process thereof, and performing a whole anisotropic etching to the other oxide film by means of a dry etching process to thus reserve the other oxide film only on the side wall of the throughhole as the oxide layer. In this case, the oxide layer on the side wall of the throughhole may be easily formed.

In addition, according to another aspect of the present invention, there is provided a manufacturing method of a semiconductor device which comprises the steps of, forming a first oxide film having a thickness of 2000 Å to 3000 Å on a substrate so as to overlie a first metal wiring disposed on the substrate by means of a plasma CVD method, forming a SOG film having a thickness of 2000 Å to 3000 Å at a plane portion thereof on the first oxide film, forming a thin silicon nitride film having a thickness of 100 Å to 300 Å on the SOG film by means of plasma CVD method, forming a second oxide film having a thickness of 4000 Å to 6000 Å on the silicon nitride film by means of plasma CVD method, performing an isotropic etching to the second oxide film at a position corresponding to the first metal wiring, forming a throughhole through the second oxide film, the silicon nitride film, the SOG film and the first oxide film respectively so as to expose the first metal wiring outward, forming a third oxide film having a thickness of 2000 Å to 3000 Å on the semiconductor device on a way of a manufacturing process thereof by means of plasma CVD method, performing a whole anisotropic etching onto the third oxide film by means of a dry etching process thus to reserve the third oxide film only on a side wall of the throughhole, and forming a second metal wiring connected to the first metal wiring through the throughhole.

In the above-mentioned manufacturing method, the thin silicon nitride film of 100 Å to 300 Å thickness which is formed on the SOG film, is not etched by etching chemicals such as dilute hydrofluoric acid etc. Thus, when an isotropic etching by chemicals such as hydrofluoric acid etc. is performed to the second oxide film on the silicon nitride film to form a taper portion, even if the second oxide film is abnormally thinner or etching rate is abnormally higher, the SOG film under the silicon nitride film is not etched. Therefore, even if there occurs a variance in the thickness of the second oxide film or in the etching rate of the chemicals, a side etching of the SOG film is not caused. Thus, there is obtained a semiconductor device of good quality, in which a disconnection or a defective connection is avoided. Moreover, since a part of the third oxide film is reserved on the side wall of the throughhole, direct contact between the second metal wiring and the SOG film is prevented in the throughhole by the residue of the third oxide film. Therefore, escape of aqueous vapor ($H_2O$) from the SOG film is prevented so that quality change of the second metal wiring due to the aqueous vapor is effectively prevented. Thus, contact resistance of the semiconductor device becomes better so that quality of the semiconductor device is highly improved.

Moreover, according to a further aspect of the present invention, there is provided a semiconductor device which comprises, a first metal wiring disposed on a substrate, an interlayer insulating film including a SOG film therein, the interlayer insulating film being formed on the substrate so as to overlie the first metal wiring partially, an oxide layer formed on a side wall of a throughhole formed through the interlayer insulating film at a position corresponding to the first metal wiring, and a second metal wiring connected to the first metal wiring through the throughhole.

In the above-mentioned semiconductor device, direct contact between the second metal wiring and the SOG film is prevented in the throughhole by the oxide layer. Therefore, escape of aqueous vapor ($H_2O$) from the SOG film is prevented so that quality change of the second metal wiring due to the aqueous vapor is effectively prevented. Thus, the contact resistance of the semiconductor device becomes better so that quality of the semiconductor device is highly improved.

In the semiconductor device, it is preferable that the interlayer insulating film further comprises a first oxide film disposed between the SOG film and the substrate, and a second oxide film disposed on the SOG film. In this case, moisture resistance of the interlayer insulating film is highly improved by the oxide films.

It is more preferable that the first oxide film has a thickness of 2000 Å to 3000 Å, the SOG film has a thickness of 2000 Å to 3000 Å at a plane portion thereof, and the second oxide film has a thickness of 4000 Å to 6000 Å. In this case, since each of the SOG film and the oxide films has a suitable thickness which is capable of providing sufficient strength thereto and of preventing an unnecessary increase of the thickness of the semiconductor device, the size of the semiconductor device is reduced. Thus, quality of the semiconductor device is further improved.

BRIEF DESCRIPTION OF THE DRAWINGS

These and other objects, features and advantages of the present invention will become clear from the following description taken in conjunction with the preferred embodiment with reference to the accompanying drawings throughout which like parts are designated by like reference numerals, and in which FIGS. 1A to 1F are vertical sectional views of a semiconductor device, which show a manufacturing method of the semiconductor device according to the present invention;

DETAILED DESCRIPTION OF THE PREFERRED EMBODIMENT

Hereinafter, a preferred embodiment of the present invention will be concretely described with reference to FIGS. 1A to 1F which show a manufacturing method of a semiconductor device according to the present invention.

Figure 1A:
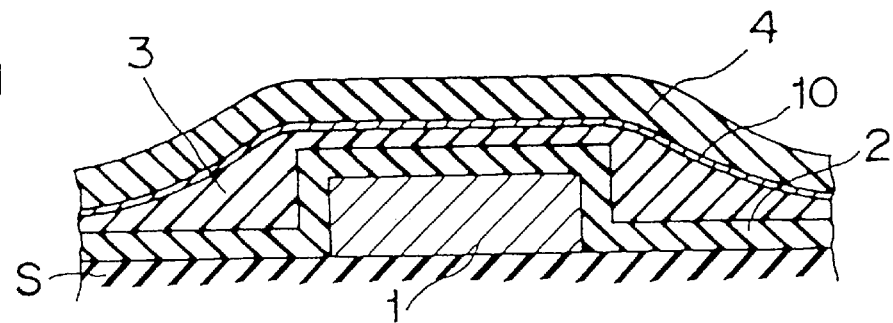

In the manufacturing method of the semiconductor device according to the present invention, as shown in FIG. 1A, at first, a patterning treatment is performed to a desired portion of a first layer aluminum wiring 1 (a first metal wiring). Hereupon, the first layer aluminum wiring 1 is disposed on a substrate S. In general, the substrate S is made of semiconductor such as silicon etc. Then, on the first layer aluminum wiring 1 and the substrate S, there is deposited a first plasma oxide (for example, silicon oxide) film 2 having a thickness of 2000 Å to 3000 Å by means of plasma CVD method. Hereupon, the first plasma oxide film 2 overlies the first layer aluminum wiring 1. Next, a SOG (Spin On Glass) film 3 whose plane portion has a thickness of 2000 Å to 3000 Å is formed on the first plasma oxide film 2 by using a coater in order to improve flatness of the upper surface. Further, a thin silicon nitride film 10 (SiN) having a thickness of about 100 Å to 300 Å is deposited on the SOG film 3 by means of plasma CVD method. Moreover, a second plasma oxide (for example, silicon oxide) film 4 having a thickness of 4000 Å to 6000 Å which is one of interlayer insulating films, is deposited on the silicon nitride film 10 by means of plasma CVD method.

Figure 1B:
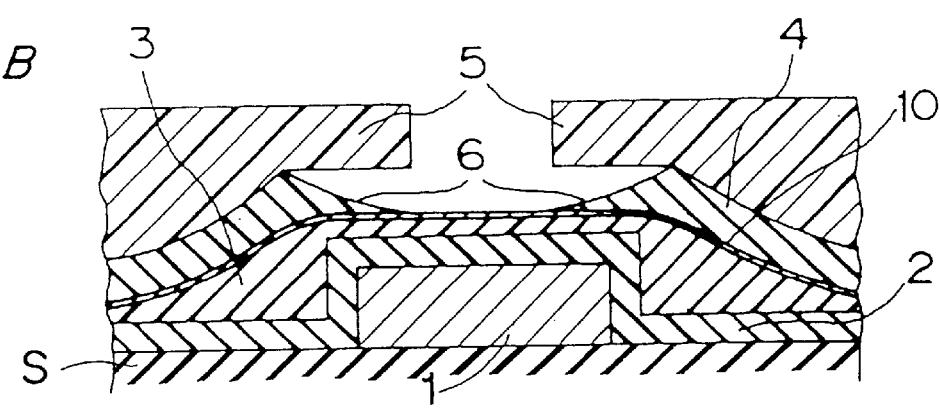

Then, there is formed a resist pattern 5 for forming a throughhole at a desired portion of the semiconductor device on the way of its manufacturing process, by means of photoengraving technique, as shown in FIG. 1B. Further, an isotropic etching is performed to the second plasma oxide film 4 by means of such chemicals as dilute hydrofluoric acid etc., thus to form a taper portion 6 for reducing the aspect ratio of the throughhole 7. Hereupon, the silicon nitride film 10 is not etched by hydrofluoric acid etc., Therefore, even if there occurs any variance in a thickness of the second plasma oxide film 4 and/or in etching rate of the chemicals, a side etching of the SOG film 3 is not caused.

Figure 1C:
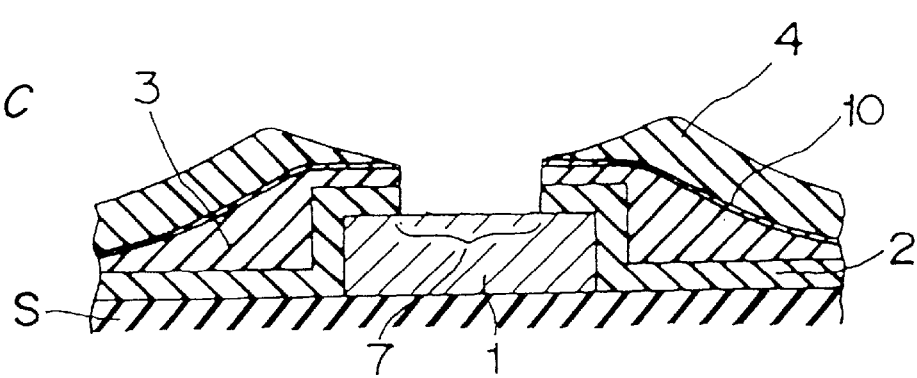
Figure 2A:
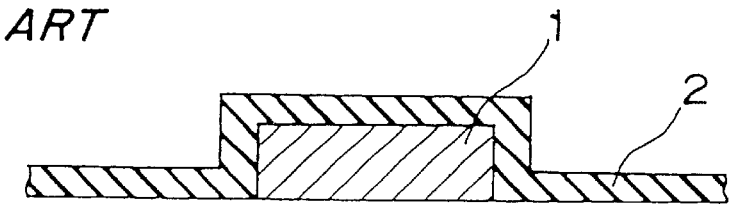
FIGS. 2A to 2D are vertical sectional views of a conventional semiconductor device, which show a conventional manufacturing method of the semiconductor device.
Figure 2B:
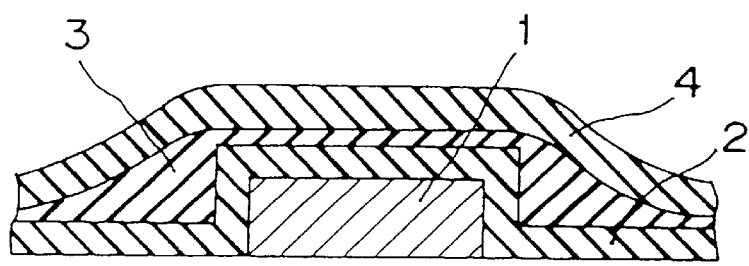
Figure 2C:
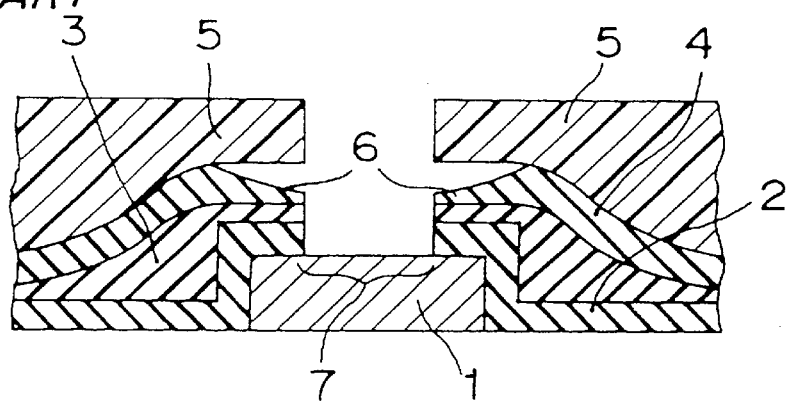
Figure 2D:
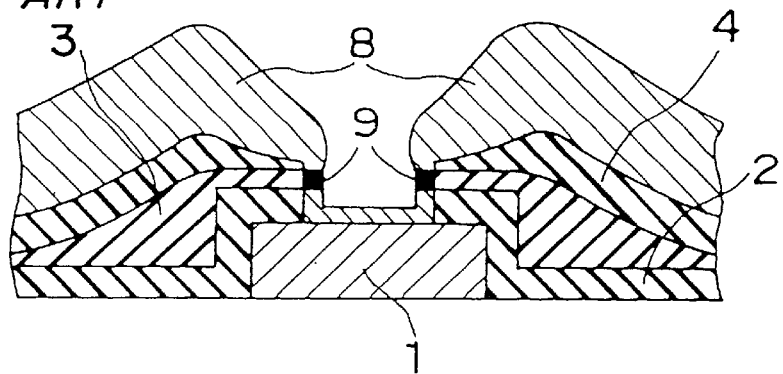
Figure 3:
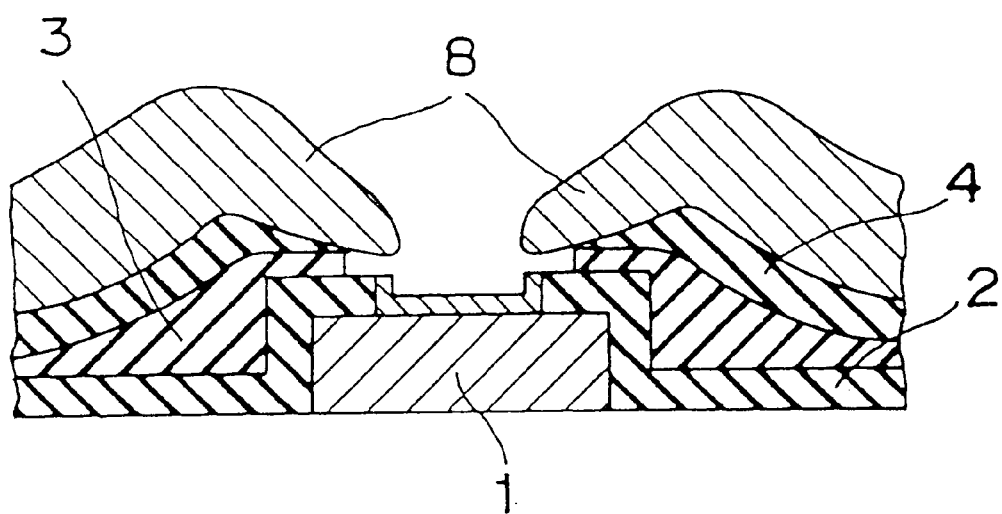
FIG. 3 is a vertical sectional view of the conventional semiconductor device, which shows a problem on the semiconductor device manufactured by the conventional manufacturing method.

Next, an anisotropic dry etching is performed to the silicon nitride film 10, the SOG film 3 and the first plasma oxide film 2 to form the throughhole 7, as shown in FIG. 1C. Thus, after the resist pattern 5 has been removed, a third oxide (for example, silicon oxide) film 11 having a thickness of about 2000 Å to 3000 Å is deposited on the surface of the semiconductor device on the way of its manufacturing process by means of plasma CVD method (Hereinafter, this oxide film is called "third plasma oxide film 11"), as shown in FIG. 1D.

Then, a whole anisotropic dry etching is performed to the third plasma oxide film 11 to preserve the third plasma oxide layer 11a (a part of the third plasma oxide film 11) only on the side wall of the throughhole 7, as shown in FIG. 1E. After that, a second layer aluminum wiring 8 (a second metal wiring) is formed by sputter method, as shown in FIG. 1F. Hereupon, the second layer aluminum wiring 8 is electrically connected to the first layer aluminum wiring 1 through the throughhole 7.

According to the above-mentioned manufacturing method, since escape of aqueous vapor ($H_2O$) from the SOG film 3 is prevented, the second layer aluminum wiring 8 is not converted to alumina. Therefore, contact resistance between the first layer aluminum wiring 1 and the second layer aluminum wiring 8 is stabilized and improved so that quality of the semiconductor device is highly improved.

What is claimed is:

1. A manufacturing method of a semiconductor device which comprises the steps of:
   a) forming an interlayer insulating film which includes a Spin on Glass (SOG) film overlying a first metal wiring disposed on a substrate, a thin silicon nitride film overlying the SOG film and an oxide film overlying the silicon nitride film;
   b) performing a chemical etching to said oxide film at a position corresponding to said first metal wiring to expose the silicon nitride film;
   c) performing a dry etching to form a throughhole through remaining portions of the interlayer insulating film so as to expose the first metal wiring outward; and
   d) forming a second metal wiring connected to said first metal wiring through said throughhole.

2. The method of claim 1, further including the step of forming an oxide layer which overlies a side wall of the throughhole, between said step c) and said step d).

3. The method of claim 2, wherein said step of forming an oxide layer includes,
   forming another oxide film onto the semiconductor device, and anisotropically etching the oxide film by a dry etching process so that the oxide film is maintained on the side wall of the throughhole.

4. A manufacturing method of a semiconductor device which comprises the steps of:
   a) disposing a first metal wiring on a substrate by a plasma CVD method;
   b) forming a first oxide film having a thickness of 2000 Å to 3000 Å on a substrate by a plasma CVD method so as to overlie the first metal wiring;
   c) forming a Spin on Glass (SOG) film having a thickness of 2000 Å to 3000 Å at a planar portion thereof on the first oxide film;
   d) forming a thin silicon nitride film having a thickness of 100 Å to 300 Å on the SOG film by a plasma CVD method;
   e) forming a second oxide film having a thickness of 4000 Å to 6000 Å on the silicon nitride film by a plasma CVD method;
   f) performing an isotropic etching to the second oxide film at a position corresponding to said first metal wiring;
   g) forming a throughhole through the second oxide film, the silicon nitride film, the SOG film and the first oxide film respectively so as to expose the first metal wiring outward;
   h) forming a third oxide film having a thickness of 2000 Å to 3000 Å on the semiconductor device by a plasma CVD method;
   i) anisotropically etching the third oxide film by a dry etching process to maintain the third oxide film only on a side wall of said throughhole; and
   forming a second metal wiring connected to the first metal wiring through said throughhole.

5. The method of claim 1, wherein said step b) of performing isotropic etching smoothes the surface of the oxide film overlying the silicon nitride film.

6. The method of claim 4, wherein said step f) of performing isotropic etching smoothes the surface of the second oxide film.

7. A semiconductor device formed according to the method of claim 4.

* * * * *